United States Patent
Käppeler et al.

(10) Patent No.: US 6,811,614 B2
(45) Date of Patent: Nov. 2, 2004

(54) CVD REACTOR WITH SUBSTRATE HOLDER WHICH IS ROTATABLY DRIVEN AND MOUNTED BY A GAS STREAM

(75) Inventors: Johannes Käppeler, Würselen (DE); Frank Wischmeyer, Aachen (DE); Rune Berge, Lund (SE)

(73) Assignee: Aixtron AG (DE)

( * ) Notice: Subject to any disclaimer, the term of this patent is extended or adjusted under 35 U.S.C. 154(b) by 0 days.

(21) Appl. No.: 10/431,986

(22) Filed: May 8, 2003

(65) Prior Publication Data

US 2004/0007187 A1 Jan. 15, 2004

Related U.S. Application Data

(63) Continuation of application No. PCT/EP01/12311, filed on Oct. 25, 2001.

(30) Foreign Application Priority Data

Nov. 8, 2000 (DE) .......................................... 100 55 182

(51) Int. Cl.$^7$ .......................... H01L 21/00; C23C 16/00
(52) U.S. Cl. ..................... 118/730; 725/728; 725/500; 117/901; 156/345.51; 156/345.52; 156/345.54; 156/345.55
(58) Field of Search ................................ 118/730, 725, 118/728, 500; 117/901; 156/345.51, 345.52, 345.54, 345.55

(56) References Cited

U.S. PATENT DOCUMENTS 3,721,210 A * 3/1973 Helms et al. ................ 118/725
5,096,534 A * 3/1992 Ozias .......................... 117/102
5,226,383 A * 7/1993 Bhat ........................... 118/730
6,039,812 A * 3/2000 Ellison et al. ............... 118/725

FOREIGN PATENT DOCUMENTS

| EP | 0 748 881 A1 | 12/1996 |
| WO | WO 89/00212 | 1/1989 |
| WO | WO 88/10324 | 12/1989 |
| WO | WO 96/23913 | 8/1996 |
| WO | WO 97/31134 | 8/1997 |
| WO | WO 98/51844 | 11/1998 |
| WO | WO 00/14310 | 3/2000 |

* cited by examiner

Primary Examiner—Gregory Mills
Assistant Examiner—Ram N Kackar
(74) Attorney, Agent, or Firm—St. Onge Steward Johnston & Reens LLC

(57) ABSTRACT

The invention relates to a device for depositing layers, particularly crystalline layers, onto substrates. Said device comprises a process chamber arranged in a reactor housing where the floor thereof, comprises at least one substrate holder which is rotatably driven by a gas flow flowing in a feed pipe associated with said floor. Said substrate holder is disposed in a bearing cavity on a gas cushion and held in place thereby. The aim of the invention is to technologically improve the design of a substrate holder which is rotatably mounted in a gas flow, particularly in a linear cross-flowing process chamber. Said bearing cavity is associated with a tray-shaped element arranged below the outflow of the feed pipe.

11 Claims, 3 Drawing Sheets

CVD REACTOR WITH SUBSTRATE HOLDER WHICH IS ROTATABLY DRIVEN AND MOUNTED BY A GAS STREAM

This application is a continuation of pending International Patent Application No. PCT/EP01/12311 filed Oct. 25, 2001, which designates the United States and claims priority of pending German Application No. 100 55 182.3, filed Nov. 8, 2000.

FIELD OF THE INVENTION

The invention relates to a device for depositing in particular crystalline layers on in particular crystalline substrates, having a process chamber which is disposed in a reactor housing and the base of which carries at least one substrate holder, which is carried on a gas cushion in a bearing recess and is driven in rotation by the gas stream which maintains the gas cushion and flows through a feed line associated with the base.

Devices of this type are used, for example, to deposit semiconductor layers from the vapor phase by means of reaction gases fed to the substrate. At least the base of the process chamber is heated, so that the reaction gases decompose in the vapor phase which is heated as a result of the process chamber wall heating, and the decomposition products condense on the substrate. WO 96/23913 has disclosed, for example, a device for the epitaxial growth of silicon carbide, in which the process chamber is formed by a graphite tube which is heated using high frequency. It is known from this document for the substrate not to be placed directly onto the process chamber base, but rather onto a plate which rests on the base.

U.S. Pat. No. 6,039,812 A has likewise already disclosed a CVD reactor for deposition of silicon carbide. In this case, the entry to the process chamber is connected to a gas inlet system by means of a tube.

U.S. Pat. No. 4,961,399 shows a CVD rector with substrate holder which is mounted rotatably on a gas cushion and is driven in rotation by the gas stream. In this case, the process chamber is disposed as a cylinder symmetrically around a gas inlet element. In this case, there is a total of five rotatable substrate holders.

The invention is based on the object of technologically developing the concept of the substrate holder mounted rotatably on a gas stream in particular in a linear-flow process chamber.

The object is achieved by the invention given in the claims.

Claim 1 provides, firstly and substantially, that the bearing recess is associated with a tray disposed above the outlet opening of the feed line. In the case of a tunnel-like, linear-flow reactor, this tray can be removed on one side, in particular through the downstream opening in the process chamber, in order to change the substrate on the substrate holder. In a preferred development of the invention, there is provision for the tray to be equipped with an annular bead. This annular bead faces downward. Within the region surrounded by the annular bead it is preferable for there to be passage openings, through which the gas which carries the substrate holder and drives it in rotation can flow. This annular bead is preferably located in an annular groove associated with a step of the process chamber base. This ensures automatic centering and holding of the tray in the step of the process chamber base. The annular bead, which preferably tapers to a sharp edge, bears against the base of the annular groove in such a manner as to form a seal, so that a closed volume is formed between the surface of the step and the underside of the tray, into which volume the opening of the feed line opens out. This volume is used to distribute the gas of the gas stream flowing through the opening to a multiplicity of passage openings, which open out, in a known way, in helical grooves in the base of the bearing recess, in order in this way to bearingly support the substrate holder and drive it in rotation. The feed line preferably runs inside a graphite body which forms the base. The feed line preferably begins below the upstream process chamber opening, so that there are two openings disposed above one another, to which gas inlet tubes can be connected in order to feed the reaction gases into the process chamber and an inert gas from the feed line. These two pipelines run parallel to one another and originate from a common gas inlet member.

An independent inventive development of the device of the generic type provides that the base is formed by a cavity section of an in particular multipart graphite tube which has a substantially rectangular internal cross-sectional profile, a gas inlet element for one or more reaction gases being associated with the first tube end, and the second tube end forming a loading opening for the process chamber, and a reaction-gas inlet tube leading from the gas inlet member to the end-side opening of the process chamber, and a separate tube leading from the gas inlet member to the feed line opening below it.

The invention also relates to a method for depositing in particular silicon carbide by means of metal-organic compounds which have been converted to the vapor phase. According to the invention, it is provided that a tray is disposed in the process chamber. This tray is removable in order for the process chamber to be loaded with the substrates and for the substrates to be unloaded from the process chamber.

BRIEF DESCRIPTION OF DRAWINGS

An exemplary embodiment of the invention is explained below with reference to appended drawings, in which.

DETAILED DESCRIPTION OF DRAWINGS

Figure 1:
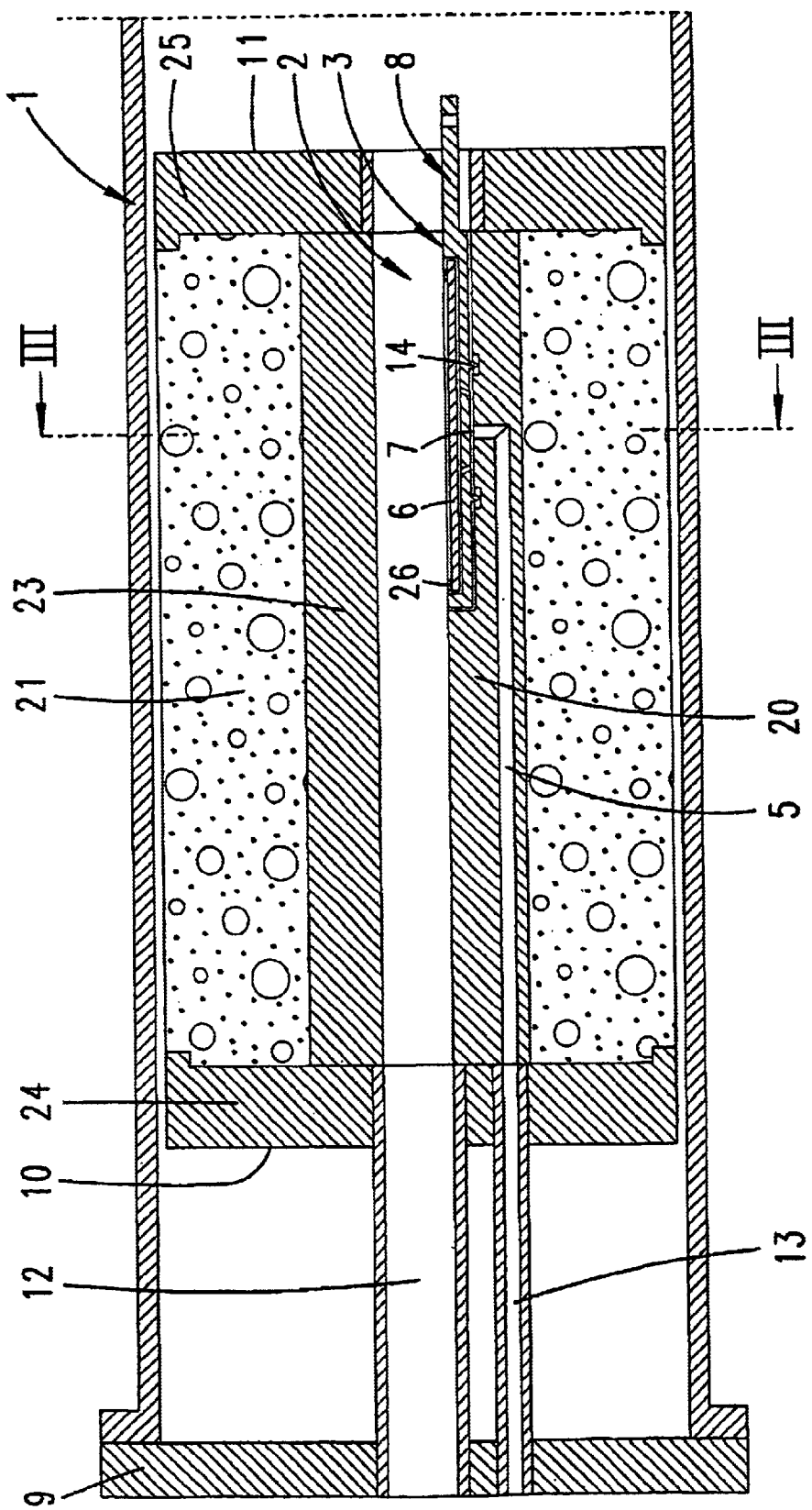
FIG. 1 shows a sectional illustration through a CVD reactor.
Figure 2:
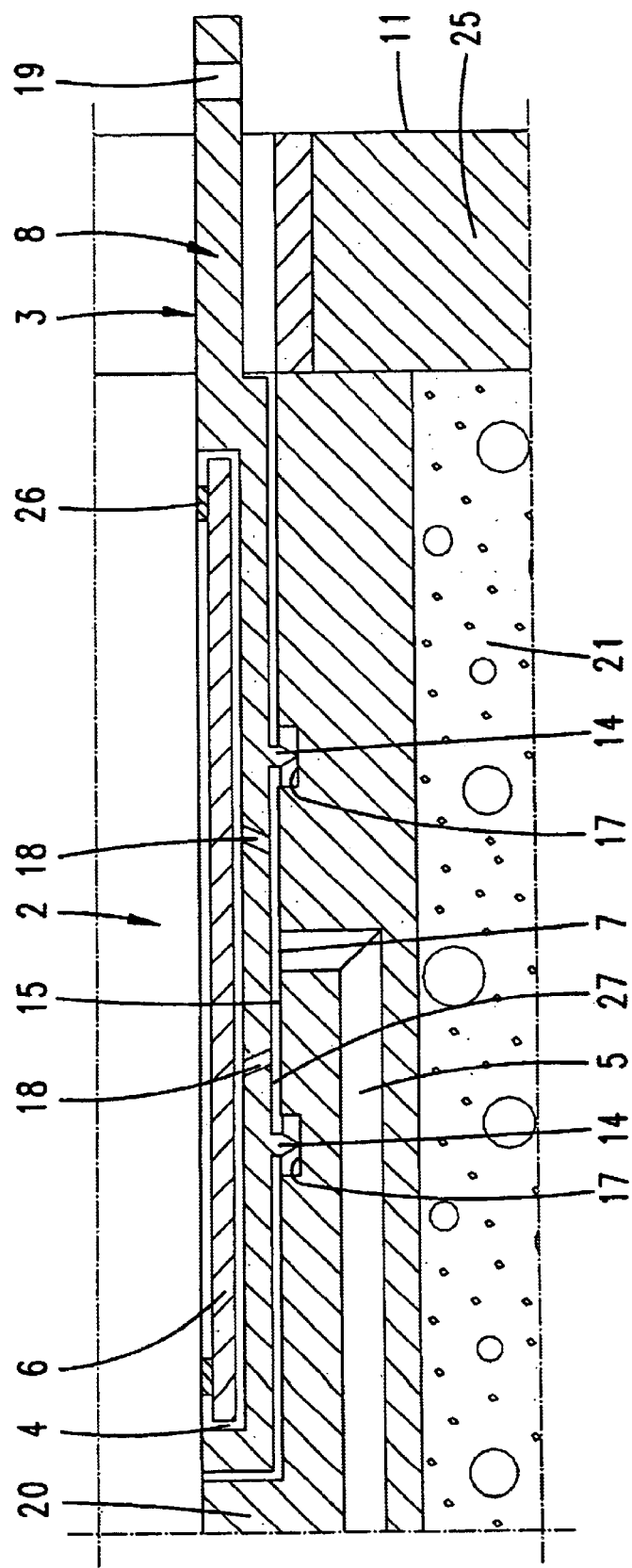
FIG. 2 shows an enlarged illustration of the base of the process chamber in the region of its downstream end.
Figure 3:
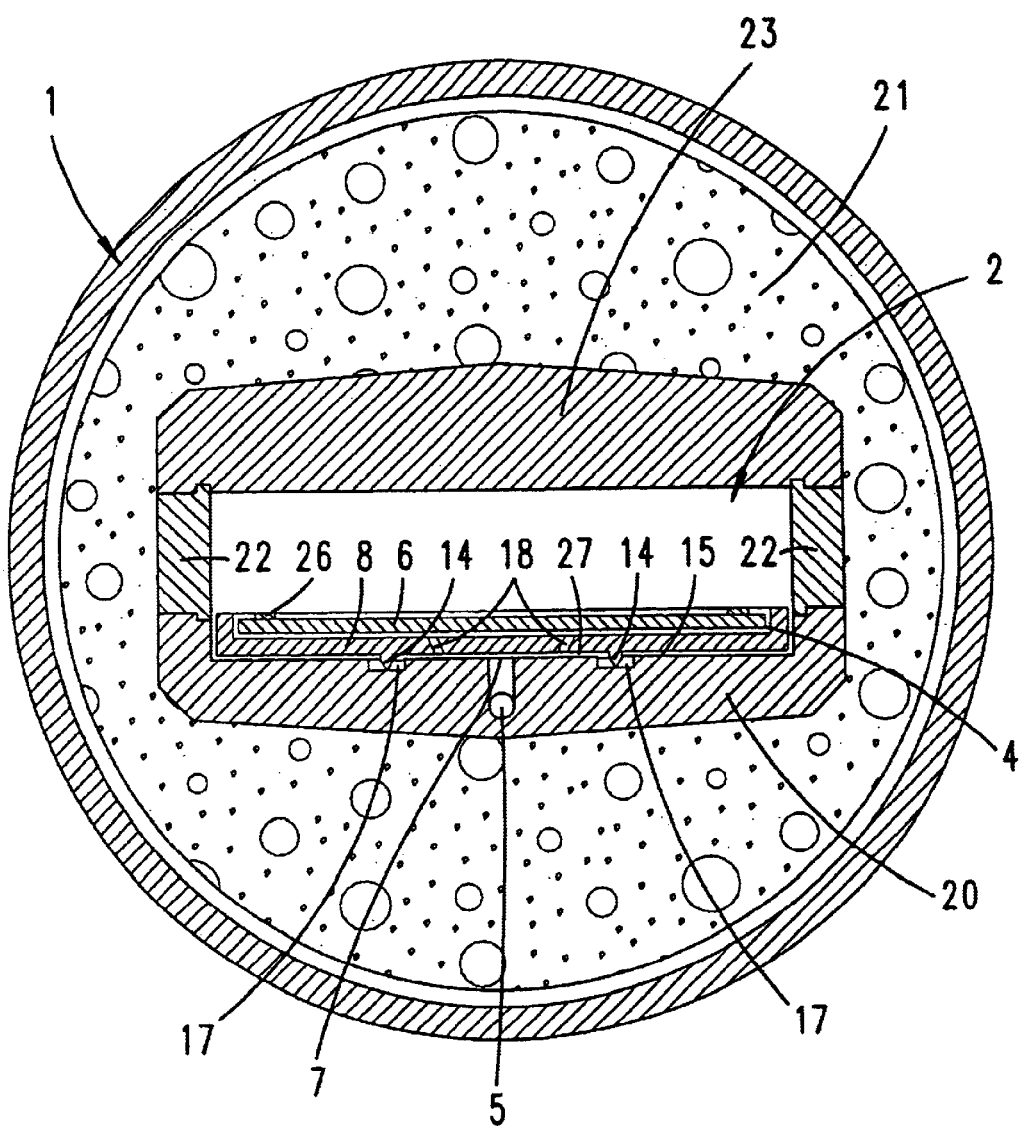
FIG. 3 shows a section on section lines III—III in FIGS. 1 and 2.

The exemplary embodiment relates to a CVD reactor for the deposition of silicon carbide layers, as is fundamentally already known from U.S. Pat. No. 6,039,812 and WO 96/23913. The rector has a reactor housing 1, which is formed as a quartz tube. Around this quartz tube there is an HF coil (not shown) for heating the process chamber. The process chamber 2 is located inside the reactor housing and comprises a multipart graphite tube. The graphite tube has a base 3 which is formed by a graphite body 20. The process chamber 2 disposed above the base 2 is laterally delimited by two walls 22, on which there is a cover 23. Around the graphite tube 20, 22, 23 there is a graphite foam sleeve 21. At both end sides of the graphite bodies 20, 22, 23 there are disks 24, 25 which consist of solid graphite.

The end opening of the process chamber 2 which is disposed at the upstream end 10 is connected to a gas inlet element 9 by means of a reaction gas inlet tube 12. The reaction gases flow through this reaction gas inlet tube 12 into the process chamber 2.

Below the reaction gas inlet tube 12 there is a tube 13 through which an inert gas is passed. This tube 13 opens out into an opening of a feed line 5 which runs in the process chamber base 3. The feed line 5 opens out into the base of a downstream step 15 of the process chamber base 3.

A tray 8 is disposed on the step 15. The step 15 forms an annular groove 17 which surrounds the outlet opening 7 of the feed line 5. An annular bead 14, which belongs to the underside of the tray 8 and tapers to a sharp edge, is supported on the base of the annular groove 17. Together with the annular groove 17, this bead 14 forms a closed volume which is a gas-distribution chamber 27. Passage openings 18 lead out of this gas distribution chamber 27 into a bearing recess 4 of the tray 8. There, the passage openings 18 open out into helical grooves (not shown) which are formed into the base of the bearing recess 4.

A substrate holder 6 which is in the form of a circular disk rests in the bearing recess 4. The gas stream which emerges through the passage opening 8 lifts the substrate holder 6 in a known way. As a result of the helical orientation of the grooves, the substrate holder 6 is not only bearingly supported by the gas stream but also is driven in rotation by it. The substrate to be coated, which is not illustrated, is located on the substrate holder 6. It may be surrounded by a silicon carbide ring 26.

The tray 8 has an extension which projects out of the downstream end 11 of the process chamber 2. This extension has a tool engagement opening 19, to which a tool can be fitted in order for the tray 8 to be removed from the process chamber 2. For this purpose, the tray 8 first has to be lifted, so that the annular bead 14 moves out of the groove 17. Then, the tray 8, together with all the substrate holders 6 located on it, can be removed from the process chamber 2.

The graphite bodies of the process chamber may be coated with silicon carbide or tantalum carbide.

The gas flow in the two pipelines 12, 13 is parallel. Accordingly, the reaction gas flow in the process chamber 2 is also parallel to the flow of the inert gas in the feed line 5.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. A device for depositing crystalline layers on a crystalline substrate, comprising a process chamber disposed in a reactor housing, the process chamber including:
   a base having a feed line associated with the base for providing a gas stream through the feed line, the feed line having an outlet opening;
   a tray disposed on the base, an upper surface of the tray including a bearing recess and a lower surface of the tray including an annular bead which defines a sealed volume in fluid communication with the said feed line;
   a substrate holder at least partially received in the bearing recess of the tray, the substrate holder being rotatable by the gas stream delivered through the outlet opening of the feed line and exiting about the bearing recess of the tray which generates a gas cushion to the substrate holder.

2. The device according to claim 1 wherein the tray bears, by means of an annular sealing bead, against a step of a graphite body which forms the base.

3. The device according to claim 2, wherein the annular sealing bead is located in an annular groove associated with the step.

4. The device according to claim 3, wherein the tray includes passage openings which, offset with respect to the outlet opening surrounded by the annular groove, are surrounded by the sealing bead, for the bearing-gas stream to pass into the bearing recess.

5. The device according to claim 1, wherein the bearing-gas stream in the feed line flows in the same direction as the flow of the reaction gases in the process chamber.

6. The device according to claim 1, wherein the tray is configured to facilitate removal from the process chamber.

7. The device according to claim 6, wherein the tray has an extension projecting out of a downstream end of the process chamber.

8. The device according to claim 7, wherein the extension of the tray has a tool engagement portion.

9. A device for depositing crystalline layers on a crystalline substrate, comprising a process chamber disposed in a reactor housing, the process chamber carrying at least one substrate holder which is carried on a gas cushion in a bearing recess disposed on an upper surface of a tray positioned on a base of the process chamber and is driven in rotation by the gas stream which maintains the gas cushion and flows through a feed line associated with the base, wherein a lower surface of the tray includes an annular bead, which defines a sealed volume in fluid communication with the said feed line.

the base is formed by a cavity section of a multipart graphite tube which has a substantially rectangular internal cross-sectional profile, a gas inlet element for one or more reaction gases being associated with a first tube end of the base and a second tube end of the base forming a loading opening for the process chamber, and a reaction-gas inlet tube leading from the gas inlet element to the first end-side opening of the process chamber and a separate tube leading from the gas inlet element to the feed line.

10. The device according to claim 9, wherein the graphite tube forming the process chamber is surrounded by a graphite foam sleeve.

11. The device according to claim 10, including graphite disks disposed in front of the end side of the graphite tube and of the graphite foam sleeve.

* * * * *